(12) United States Patent
Hosokawa et al.

(10) Patent No.: US 6,400,045 B1
(45) Date of Patent: Jun. 4, 2002

(54) COOLING FAN CONTROLLER

(75) Inventors: Kiyomasa Hosokawa; Tomokazu Yamada, both of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/691,133

(22) Filed: Oct. 19, 2000

(30) Foreign Application Priority Data

Mar. 31, 2000 (JP) ........................................ 2000-096812

(51) Int. Cl.$^7$ .............................................. G12B 15/04
(52) U.S. Cl. ........................................ 307/117; 361/695
(58) Field of Search .............................. 307/117, 125, 307/130, 131; 361/695–697

(56) References Cited

U.S. PATENT DOCUMENTS

| | | | | |
|---|---|---|---|---|
| 5,436,827 A | * | 7/1995 | Gunn et al. ................ | 361/695 |
| 5,757,172 A | * | 5/1998 | Hunsdorf et al. ........... | 323/277 |
| 5,761,085 A | * | 6/1998 | Giorgio ..................... | 361/695 |
| 5,777,897 A | * | 7/1998 | Giorgio ..................... | 364/557 |
| 5,848,282 A | * | 12/1998 | Kang ........................ | 361/695 |
| 5,963,424 A | * | 10/1999 | Hileman et al. ............ | 361/695 |
| 5,963,887 A | * | 10/1999 | Giorgio ..................... | 361/697 |
| 6,011,371 A | * | 1/2000 | Van Brocklin et al. ...... | 318/471 |

FOREIGN PATENT DOCUMENTS

| | | | | |
|---|---|---|---|---|
| EP | 0090514 A1 | * | 10/1983 | ......... G05D/23/24 |
| JP | 6-98592 | | 4/1994 | |
| JP | 7-248852 | | 9/1995 | |
| JP | 9-264647 | | 10/1997 | |

OTHER PUBLICATIONS

Derwent abstract only of CN 1221249 A, Jun. 30, 1999, to X Xie, H02P 007/06.*

* cited by examiner

*Primary Examiner*—Fritz Fleming
(74) *Attorney, Agent, or Firm*—Armstrong, Westerman & Hattori, LLP (57) ABSTRACT

The first fan control circuit controls the rotation speed of the cooling fan in response to the environmental temperature. The second fan control circuit detects the output power capacity of the power supply circuit feeding the load. The second fan control circuit allows cooling fan control in response to the environmental temperature by the first fan control circuit when the output power capacity is at least a prescribed threshold value, and disables rotation control of the cooling fan in response to the environmental temperature by the first fan control circuit to control the fan to a prescribed maximum value.

10 Claims, 7 Drawing Sheets

COOLING FAN CONTROLLER

BACKGROUND OF THE INVENTION

1. Field of the Invention

The present invention relates to a cooling fan controller which cools the interior of a machine such as a computer by forced circulation of air through control of the rotation speed of a cooling fan. More particularly, the invention relates to a cooling fan controller which controls the rotation speed of fan on the basis of an environmental temperature and an output power capacity to a load.

2. Description of the Related Art

In a cooling fan controller cooling the interior of a machine such as a personal computer by forced circulation of air through rotation of a cooling fan, it is the conventional practice to control the rotation speed of the cooling fan through detection of only the environmental temperature in the machine interior by using a temperature detecting element such as thermistor. More specifically, since resistance value of thermistor varies substantially in inverse proportion to a change in the environmental temperature, when the environmental temperature becomes higher and the resistance value of thermistor is reduced, the rotation speed of the fan is increased by increasing driving current fed to a fan motor. When an increase in the resistance value of the thermistor is caused by a decrease in the environmental temperature, the rotation speed of the fan is reduced by reducing the driving current fed to the fan motor.

The environmental temperature in a machine is caused by heat production resulting from power loss occurring upon operation of circuit units or devices fed with power. There is therefore a time lag to some extent before a change in the environmental temperature. In the conventional temperature. In the conventional cooling fan controller controlling the rotation speed of the cooling fan by detection of the environmental temperature alone by means of thermistor, therefore, a considerable heat generation of the load may lead to a large increase in temperature in the machine as a result of a delay in control of the rotation speed of the fan by acting on the environmental temperature, and this may take much time. It is therefore necessary to adopt a rotation heat sink larger in size used in the circuit or the machine and to use parts of a higher rating in terms of standard value relative to the environmental temperature for the parts, taking account of the temperature increase caused by a delay in cooling, thus forming a cause of a higher cost.

SUMMARY OF THE INVENTION

According to the present invention, there is provided a cooling fan controller permitting effective cooling without causing a delay in time by accurately detecting factors of a sudden heat generation.

The invention relates to a cooling fan controller which cools the interior of a machine by forced circulation of air under control of the rotation speed (revolutions) of a cooling fan, comprising a first fan control circuit which controls the rotation speed of the cooling fan in response to the environmental temperature; and a second fan control circuit which detects the output power capacity of a power supplying section supplying power to a load, and which, when the output power capacity is under a prescribed threshold value, allows control of the cooling fan in response to the environmental temperature by the fist fan control circuit, and when the output power capacity is at least the prescribed threshold value, disables cooling fan control in response to the environmental temperature by the fan control circuit to control the same at a prescribed maximum rotation speed. As a result, in the cooling fan controller of the invention, when there is an increase in the output power capacity from the power supply circuit to a load at a low environmental temperature in a machine, cooling based on a sufficient forced circulation of air is started before an increase in the environmental temperature resulting from heat generation of the load, and it is possible to ensure prevention of a large increase in environmental temperature caused by a delay in cooling. It is therefore possible to inhibit increase in temperature of a machine or parts used in a machine, reduce the rating of the parts employed, reduce the size of a radiation heat sink, and thus reduce the cost of the machine. The first fan control circuit is a circuit which supplies a driving current substantially proportional to the environmental temperature detected with a temperature detecting element such as thermistor to a fan motor. The second fan control circuit has a comparing circuit which causes supply of a current to the fan motor in response to the environmental temperature based on the first fan control circuit with an L-level output when the detected value of the output current capacity of the power supply circuit is under a prescribed threshold value, and disables control of the cooling fan in response to the environmental temperature of the first fan control circuit with an H-level output when the detected value is at least the prescribed threshold value, to cause supply of a prescribed maximum driving current to the fan motor. The second fan control circuit has a differential amplifying circuit which amplifies a detection signal of the output current capacity of the power supply circuit in the first half stage of the comparing circuit. The first fan control circuit comprises a first transistor which feeds collector current substantially proportional to a change in the resistance value of thermistor inversely proportional to temperature, and a second transistor which receives supply of base current obtained by subtracting the collector current of the first transistor from the prescribed bias current and supplies collector current to the fan motor; causes a change in collector current in response to the resistance value of the thermistor by biassing the base of the first transistor in the forward direction with an H-level output of the second fan control circuit; brings the collector current to zero by cutting off the base of the first transistor by reverse direction bias with an L-level output of the second fan control circuit; and fixes the collector current of the second transistor at a prescribed maximum current. Any of the following embodiments is applicable for detecting the output power capacity fed from the power supply circuit to the load. The second control circuit detects current supplied from the power supply circuit to the load and compares the detected current with a prescribed threshold value. When the power supply circuit is a switching regulator, the second fan control circuit detects voltage of a secondary-side winding of a transformer provided in the switching regulator and compares the detected voltage with a prescribed threshold value. Furthermore, when the power supply circuit is a switching regulator, the second fan control circuit detects current fed by a switching element such as an EFT provided in the switching regulator to a primary-side winding of a transformer and compares the detected current with a prescribed threshold value. When the power supply circuit is a switching regulator, furthermore, the second fan control circuit detects input voltage to a primary-side winding of a transformer provided in the switching regulator.

In other words, the cooling fan controller of the invention comprises an output detecting unit detecting the output capacity to a load; a temperature detecting unit detecting environmental temperature; and a control unit which controls the rotation speed of a cooling fan on the basis of the output capacity and the environmental temperature, and when the output capacity is under a prescribed value, invalidates the control based on the environmental temperature. In this case, when the output capacity is at least a prescribed value, the control unit invalidates the control based on the environmental temperature, and controls the cooling fan at a prescribed maximum rotation speed.

The above and other objects, features, and advantages of the present invention will become more apparent from the following detailed description with reference to the drawings.

DETAILED DESCRIPTION OF THE PREFERRED EMBODIMENTS

Figure 1:
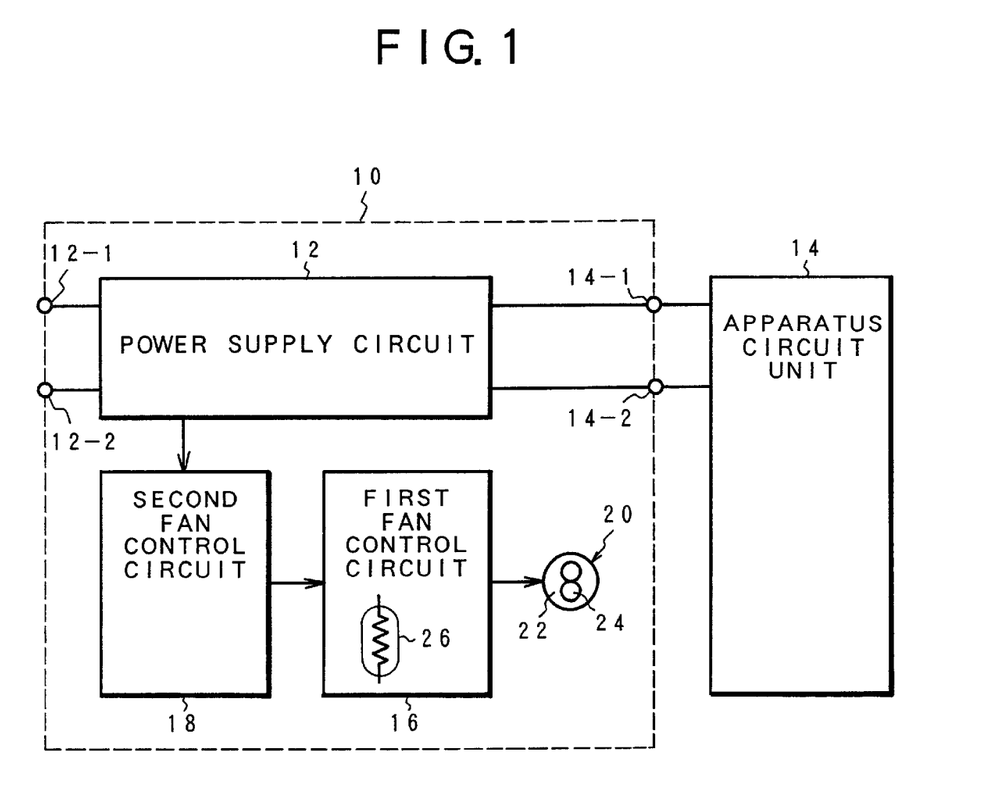
FIG. 1 is a block diagram of the basic configuration of the present invention.

FIG. 1 is a block diagram illustrating a basic embodiment of the cooling fan controller of the present invention. In this embodiment, the cooling fan controller comprises a power supply unit 10 and a controller circuit unit 14. The power supply unit 10 has a power supply circuit 12 in which an input of, for example, a commercial AC 100 V into AC input terminals 12-1 and 12-2 leads to output of a CD output, for example, DC 12 V necessary for the controller circuit unit 14 from DC output terminals 14-1 and 14-2. In this embodiment, a first fan control circuit 16, a second fan control circuit 18, and a cooling fan 20 composing the cooling fan controller of the invention are provided in the power supply unit 10. While the cooling fan 20 is illustrated in the power supply unit 10 for the convenience of explanation, it may actually be in a configuration not incorporating it in the power supply unit 10. In this case, the cooling fan 20 is installed at an appropriate position the most suitable for forced circulation necessary for cooling the interior of the machine. The cooling fan is rotation-driven by attaching a fan 24 to a fan motor 22. The first fan control circuit 16 has, for example, a thermistor 26 serving as an element for detecting the environmental temperature, and rotation-controls the cooling fan 20 in response to the environmental temperature in the machine interior detected by the thermistor 26. In the invention, in addition to the first fan control circuit 16 which controls the rotation speed of the cooling fan 20 in response to the environmental temperature, a second fan control circuit 18 is provided. The second fan control circuit 18 detects an output power capacity feeding the apparatus circuit unit 14 as a load from the power supply circuit 12, and switches over the control status of the first fan control circuit 16 on the basis of this detection. That is, the second fan control circuit 18 detects an output power capacity to a load by the power supply circuit 12, compares the result with a prescribed threshold value, and when the output power capacity is under the prescribed threshold value, allows control of the cooling fan 20 in response to the environmental temperature detected by the thermistor 26 of the first fan control circuit 16. In contrast, when the output power capacity is at least the threshold value, the second fan control circuit 18 disables control of the cooling fan 20 in response to the environmental temperature detected by the thermistor 26 through the first fan control circuit 16, and causes rotation control at a prescribed maximum rotation speed. As a result, even at a low environmental temperature in the machine interior as detected by the thermistor 26, when the output power capacity feeding the apparatus circuit unit 14 from the power supply circuit 12 increases to over a prescribed threshold value, the second fan control circuit 18 performs control so that the cooling fan 20 is controlled by the first fan control circuit 16 to reach the maximum rotation speed. When the output power capacity to the apparatus circuit unit 14 increases to over the threshold value, the cooling fan 20 is always controlled to the maximum rotation speed irrespective of the environmental temperature.

Figure 2:
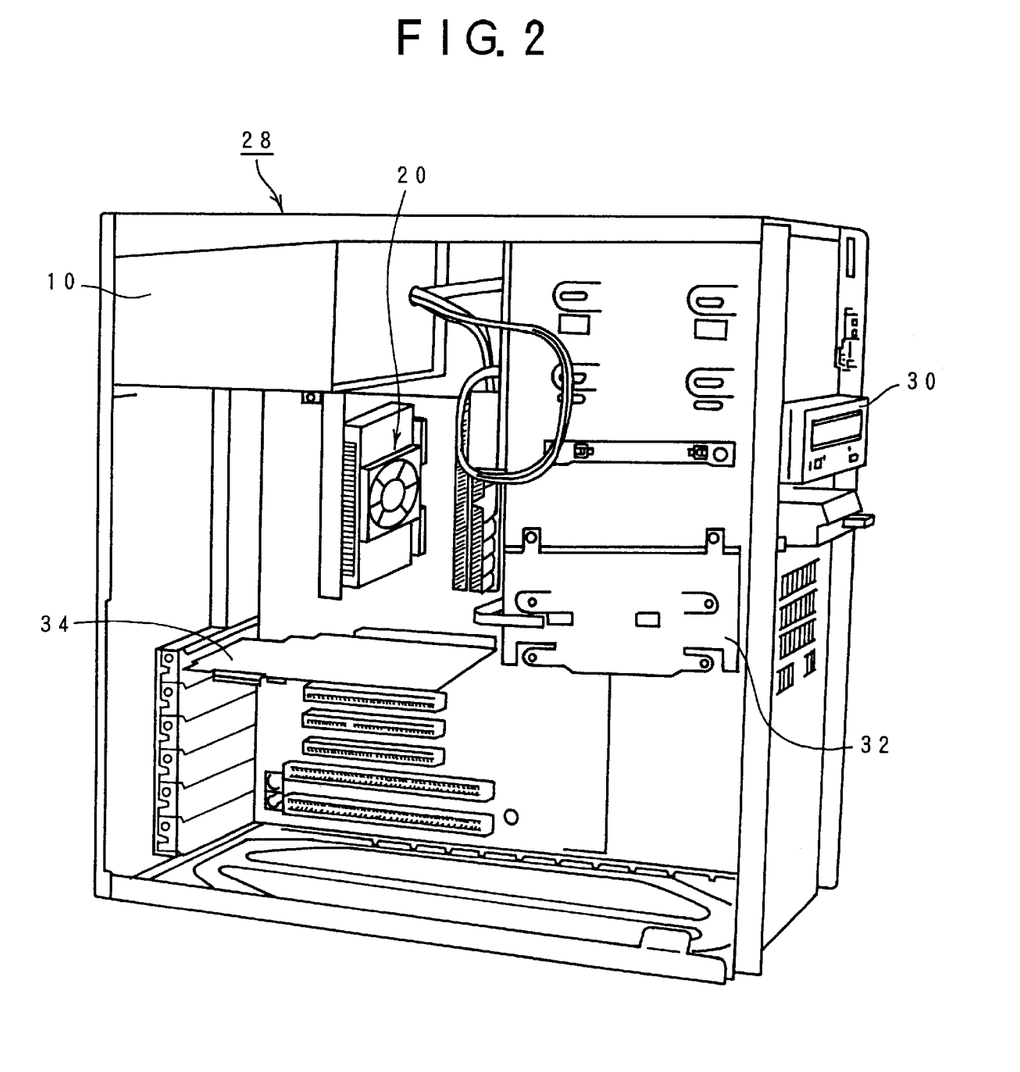
FIG. 2 is a descriptive view of the main body of a personal computer.

FIG. 2 illustrates the internal structure of a microcomputer main body to which the cooling fan controller of the present invention is applied. The machine main body 28 houses therein a power supply unit 10 on top to the right, and a cooling fan 20 is arranged thereunder. To the right of the machine main body 28, a floppy disk drive 30 and a hard disk driver 32 are housed, and a display card 34 is attached to a connector arranged on the bottom to the left.

Figure 3:
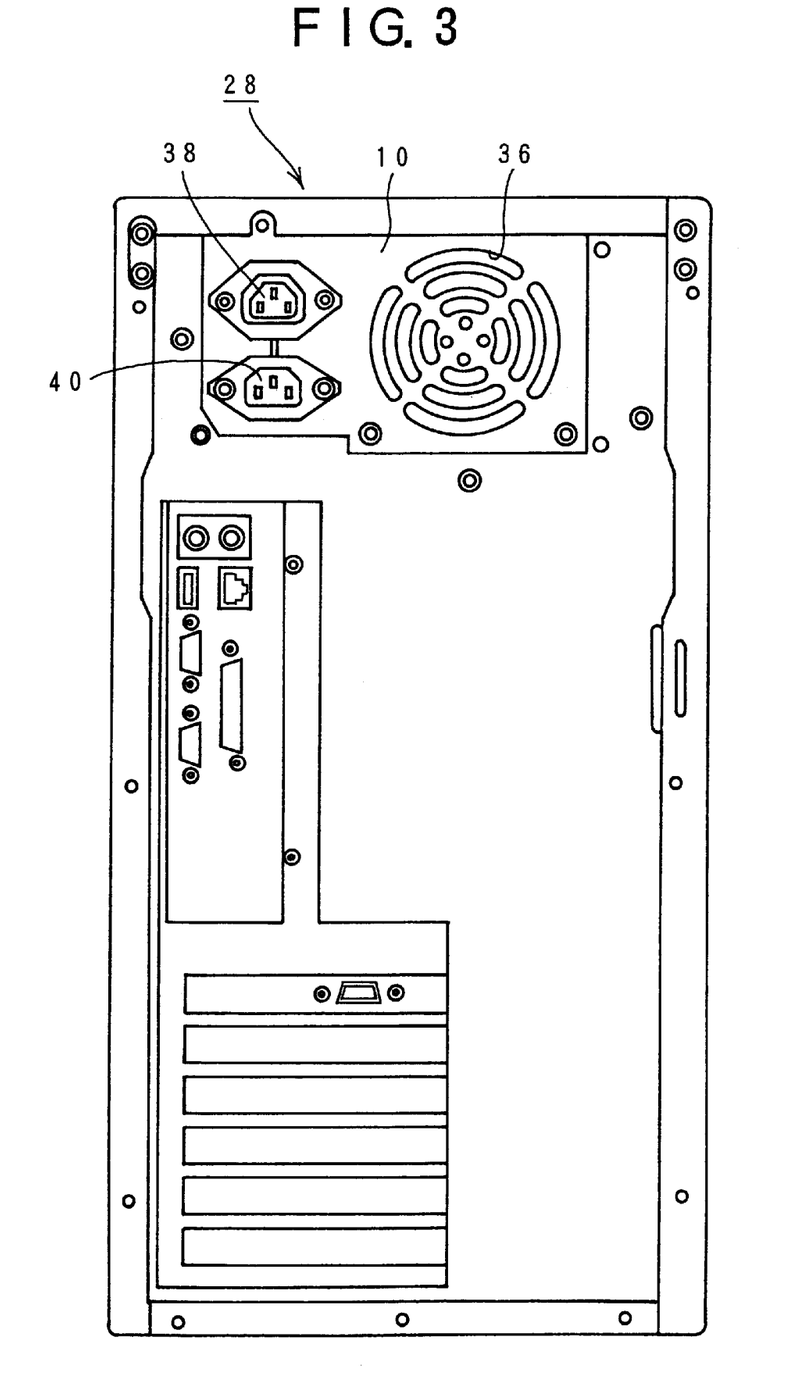
FIG. 3 is a descriptive view of a side on the power supply unit housing-side of FIG. 2.

FIG. 3 illustrates a side surface on the power supply unit 10 side. In this embodiment, a ventilation port 36 for exhausting air from the cooling fan 20 provided therein by forced circulation to outside is provided in the panel portion of the power supply unit 10. To the left of the ventilation port 36, there are provided an AC connector 38 conducting AC input and another AC connector 40 carrying out AC output to the other machines. In the machine main body 28 shown in FIG. 2, the cooling fan 20 is provided outside the power supply unit 10. For some machines, however, the cooling fan 20 may be provided in the supply unit 10.

Figure 4:
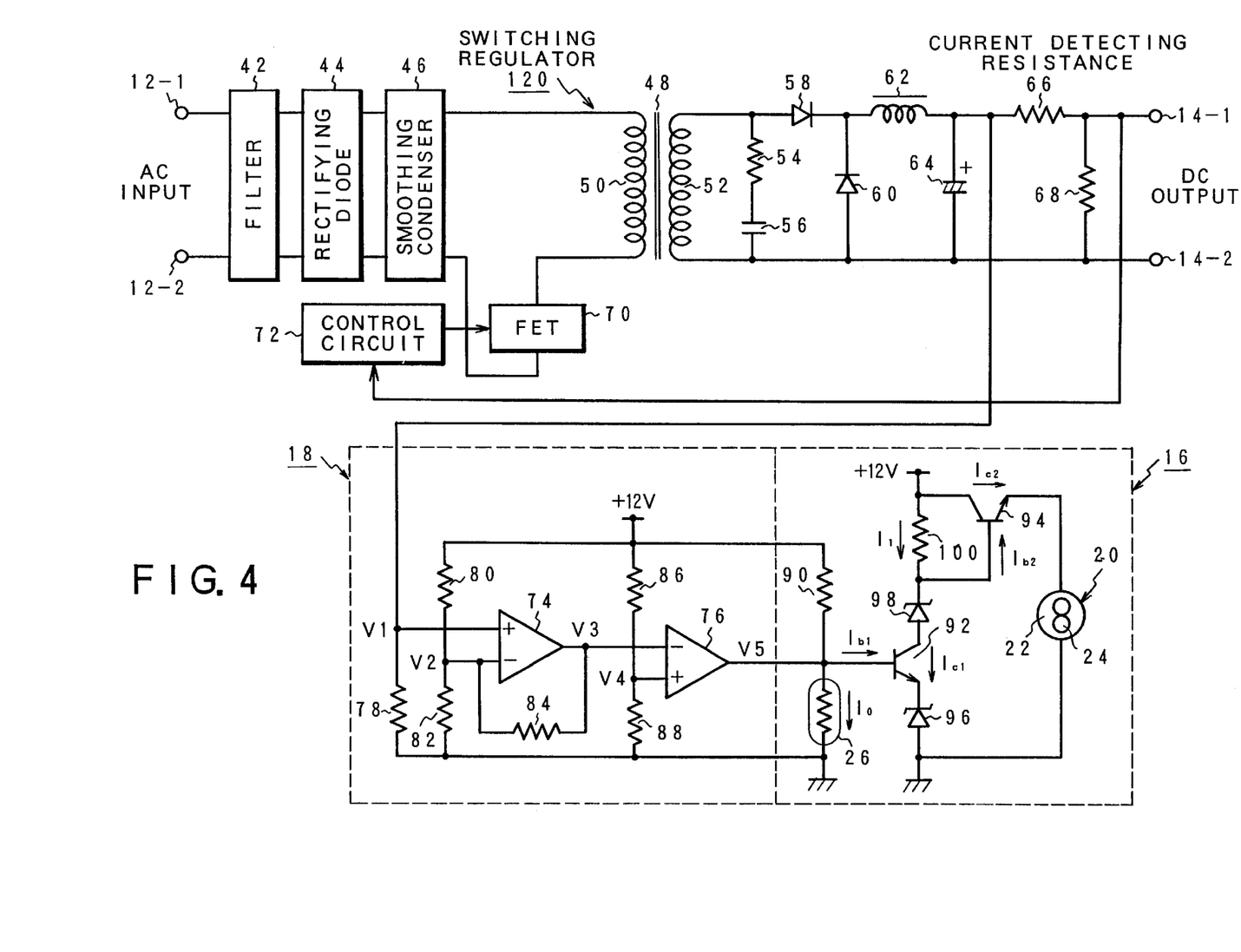
FIG. 4 is a circuit diagram of an embodiment of the invention, which detects an output power capacity from an output current of a switching regulator.

FIG. 4 is a circuit diagram of a concrete embodiment of the cooling fan controller of the invention. In this embodiment, a switching regulator 120 is used as the power supply unit 12 shown in FIG. 1. The switching regulator 120 serving as a power supply circuit comprises AC input terminals 12-1 and 12-2, followed by a filter 42, a rectifying diode 44 and a smoothing capacitor 46, and an AC input is converted into a prescribed DC input voltage by this circuit section. The smoothing capacitor 46 is followed by a transformer 48 which comprises a primary winding 50 and a secondary winding 52. An FET 70 acting as a switching element is connected in series to the primary winding 50, and the FET 70 is switching-controlled by a control circuit 72. The control circuit 72 controls the switching period and the switching frequency of the FET 70 so as to enter an output voltage of the switching regulator 120 to maintain a certain prescribed voltage. A resistance 54 and a capacitor 56 connected in series into a circuit for absorbing noise are provided in parallel with the secondary winding 52 of the transformer 48. These are followed by a rectifying circuit for obtaining a voltage doubler provided with diodes 58 and 60. Then, a smoothing capacitor 64 is provided via a chalk coil 62 for removing ripple. Following the smoothing capacitor 64, a current detecting resistance 66 for detecting output current supplied from the output terminal 14-1 to the load is provided. A resistance of a small resistance value is used as the current detecting resistance 66 to reduce the resistance loss. The current detecting resistance 66 is followed by a dummy load resistance 68. Even under the no-load condition, a specified DC output is available from the switching regulator 120 by feeding a slight output current to the dummy load resistance 68. The control circuit 72 is for determining an error voltage by entering a DC voltage of a DC output between the output terminals 14-1 and 14-2 and comparing it with a prescribed reference value. PWM control for controlling the ON-period of the FET 70 is applied so as to eliminate this error voltage. The apparatus circuit unit 14 shown in FIG. 1 is connected as a load to the DC output terminals 14-1 and 14-2 of the switching regulator 120 as described above, so that a specified DC voltage is always stably output even upon variation of the load current. The first fan control circuit 16 and the second fan control circuit 18 composing the cooling fan controller of the invention are provided for the switching regulator 120. The first fan control circuit 16 comprises a thermistor 26, a bias resistances 90 and 100, a first transistor 92, a second transistor 94 and Zener diodes 96 and 98. That is, a serial circuit of the bias resistance 90 and the thermistor 26 is connected to a power supply +12 V, and the connecting points of the both are connected to the base of the first transistor 92. A collector of the first transistor 92 is connected, together with an end of the bias resistance 100, to the base of the second transistor 94. The collector of the second transistor 94 is connected to a power supply line of +12 V, and a fan motor 22 for the cooling fan 20 is connected as a load between an emitter and an earth. The second fan control circuit 18 has a differential amplifier 75 using an operating amplifier, and comparator 76 using an operating amplifier. A detected voltage of an output voltage to the load detected by the current detection resistance 66 provided on the output side of the switching regulator 120 is entered into a plus input terminal of the differential amplifier 74, and is added as an input voltage V1 to the both ends of the resistance 78. A certain voltage V2 resulting from voltage division of the resistances 80 and 82 is impressed to an inverted input terminal of the differential amplifier 74, and a feedback resistance 84 is connected between the same and the output. As a result, the differential amplifier 74 produces an output voltage V3 obtained by multiplying the difference between the input voltage V1 and the certain voltage V2 (V1–V2) by an amplifying rate dependent upon the ratio of the resistance 80, 82, and 84. This output voltage V3 takes a value corresponding to the output current fed by the switching regulator 120 to the load. Because the output voltage of the switching regulator is constant, it is possible to determine a value corresponding to the output power capacity for the load by detecting a change in the output current. For the comparator 76, the output voltage V3 of the differential amplifier 74 is connected to the minus input terminal, and the reference voltage V4 obtained by dividing voltage with serial circuits of the resistances 86 and 88 is entered into the plus input terminal. This reference voltage V4 sets a threshold value of the output power capacity fed from the switching regulator 120 to the load. When the output voltage V3 of the differential amplifier 74 is smaller than the reference voltage V4, the comparator 76 produces an output voltage V5 becoming on an H-level. When the output voltage V3 becomes at least equal to the reference voltage V4, the output voltage V5 is inverted on an L-level. When the output of the comparator 76 of the first fan control circuit 18 is on an H-level, i.e., when the output power capacity fed from the switching regulator 120 to the load is under a threshold value dependent upon the reference value V4, the first fan control circuit 16 controls the cooling fan 20 in response to the environmental temperature detected by the thermistor 26. That is, when the output voltage V5 of the comparator 76 is on an H-level, a certain voltage corresponding to the H-level of the output voltage V5 is impressed on the thermistor 26, and as a result, the current $I_0$ flowing through the thermistor 26 varies in response to the resistance value of the thermistor 26 corresponding to the environmental temperature in the interior of the machine. The resistance value of the thermistor 26 is in a substantially inversely proportional relationship with the increase in temperature. The base current $I_{b1}$ flowing through the first transistor 92 is in a contrary relationship with the current $I_0$ flowing through the thermistor 26. When the environmental temperature is low and current $I_0$ of the thermistor 26 is reduced by the increase in resistance value, base current $I_{b1}$ flowing into the transistor increases. An increase in base current $I_{b1}$ results in an increase in collector current $I_{c1}$ flowing into the transistor 92. The current $I_1$ flowing into the bias resistance 100 is in the following relationship with the transistor, the collector current $I_{c1}$ of the transistor 92, and the base current $I_{b2}$ of the transistor 94:

$$I_1 = I_{c1} + I_{b2}$$

In contrast, therefore, when the collector current $I_{c1}$ of the transistor 92 increases, the base current $I_{b2}$ of the transistor 94 decreases, and the collector current $I_{c2}$ of the transistor 94 to be fed to the fan motor 22 of the cooling fan 20 decreases as well. That is, a low environmental temperature detected by the thermistor leads to a decrease in the collector current $I_{c2}$ of the transistor 94 flowing into the fan motor 22 and a lower rotation speed of the fan 24 provided in the cooling fan 20. On the contrary, an increase in the environmental temperature results in a decrease in the resistance value of the thermistor 26, hence in an increase in the current $I_c$ and a decrease in the base current $I_{b1}$ This leads also in a decrease in the collector current $I_{c1}$ of the transistor 92, whereas the base current $I_{b2}$ of the transistor 94 increases. As a result, the collector current $I_{c2}$ of the transistor increases, and a high environmental temperature brings about an increase in the rotation speed of the cooling fan 20. While the comparator 76 provided in the second fan control circuit 18 is generating an H-level output as an output voltage V5, i.e., the output power capacity from the switching regulator 120 to the load is under the threshold value, the first fan control circuit 16 controls the rotation speed of the cooling fan 20 in response to the environmental temperature detected by the thermistor 26. In contrast, when the output power capacity fed from the switching regulator 120 to the load increases and this causes an increase in output current as detected by the current detecting resistance 66 increases, and the output voltage V5 of the comparator 76 of the second fan control circuit 18 is reversed from H-level to L-level, the first transistor 92 is cut off. When the first transistor 92 is cut off, the collector current $I_{c1}$ thereof becomes zero, and the bias current $I_1$ of the bias resistance 100 becomes as it is the base current $I_{b2}$, i.e., $I_1 = I_{b2}$, resulting in that the collector current $I_{c2}$ of the transistor 94 becomes the maximum current. The collector current $I_{c2}$ having become the maximum current flows into the fan motor 22, and this causes the cooling fan 20 to drive the fan 24 at the maximum rotation speed. Switching of the cooling fan 20 to the maximum rotation speed when the output power capacity by the second fan control circuit 18 to the load is preferentially accomplished irrespective of the level of the environmental temperature detected by the thermistor 26.

Figure 5:
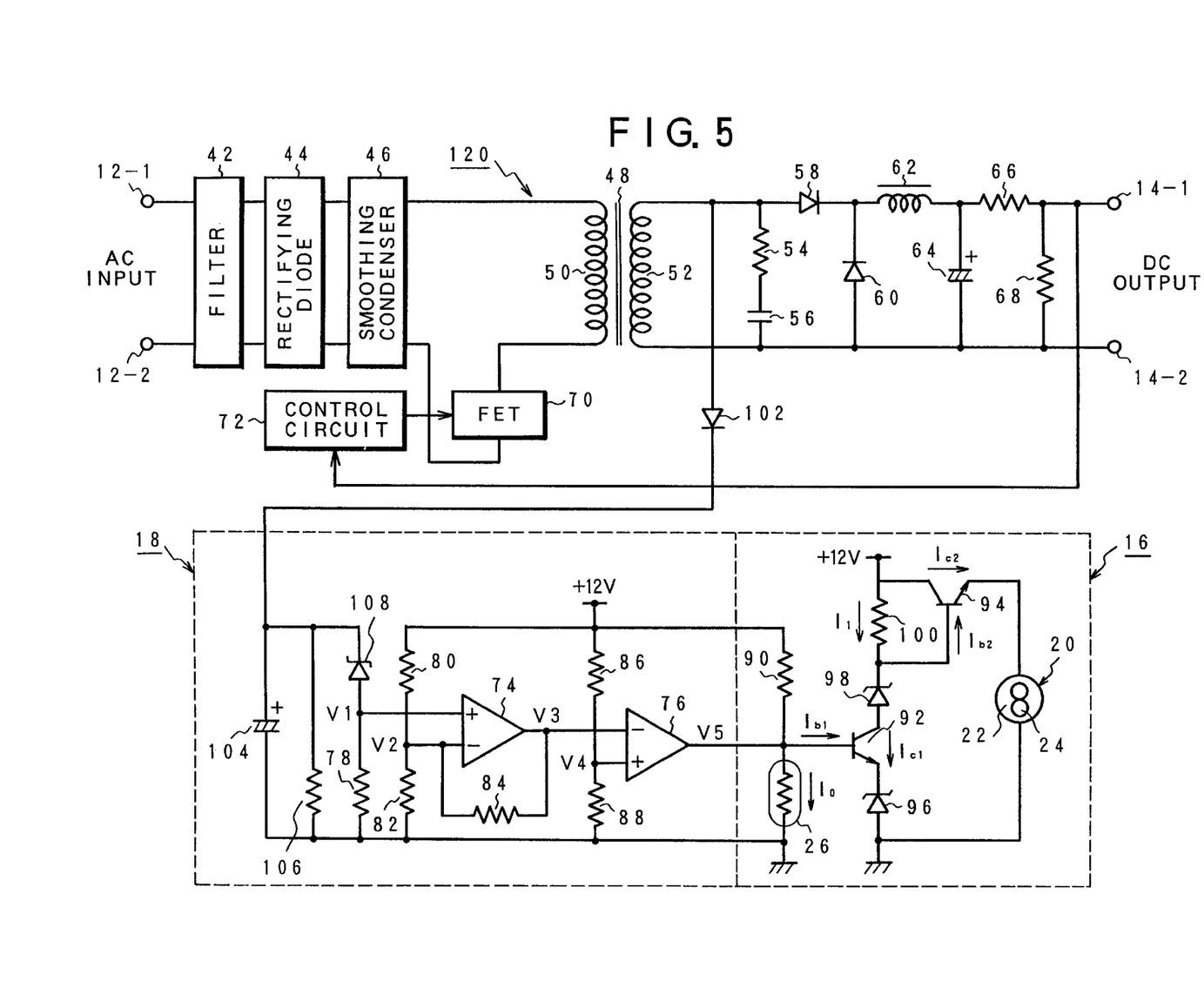
FIG. 5 is a circuit diagram of an embodiment of the invention, which detects an output power capacity from a transformer secondary winding voltage of the switching regulator.

FIG. 5 shows another embodiment of the invention, using a switching regulator 120 as a power supply circuit. This embodiment is characterized in that the output power capacity to a load is detected from the output voltage of a secondary winding 52 of a transformer 48 provided in the switching regulator 120. The switching regulator 120 is the same as in the embodiment shown in FIG. 4, and the first fan control circuit 16 and the second fan control 18 are also basically the same as in the embodiment shown in FIG. 5. In this embodiment, the output from the output terminal on one side of the secondary winding 52 of the transformer 48 of the switching regulator 120 is connected as an input into the secondary fan control circuit 18 via a diode 102, and a rectifying/smoothing circuit having a capacitor 104, a resistance 106 and a Zener diode 108 is provided at the input terminal. More specifically, a plus voltage induced by the switching control of the FET 70 in the secondary winding 52 rectified by the diode 102, and then, smoothed by the capacitor 104 to produce a DC voltage proportional to the secondary winding voltage at the both ends of the resistance 106. The detection voltage produced at the both ends of this resistance 106 is applied to the plus input terminal of the differential amplifier 74 using an operating amplifier via the Zener diode. The Zener diode 108 is a secondary winding, and has peaks over the plus level. It serves therefore as a noise removing circuit by absorbing these peaks. A change in the output power capacity fed from the switching regulator 120 to the load appears as a change in voltage of the secondary winding 52 in the stabilizing control of the switching regulator. More specifically, an increase in the output power capacity to the load leads to a decrease in the DC output voltage thereof, and the control circuit 72 increases the energy for converting the primary side to the secondary side of the transformer 48 by increasing the ON-time in the switching control of the FET 70 so as to make up this decrease in the output voltage. As a result, the induced voltage of the secondary winding 52 increases along with the increase in the output power capacity to the load. Therefore, the detection voltage V1 resulting from rectification-smoothing of the output voltage of the secondary winding is entered into the differential amplifier 74 of the second fan control circuit 18, and compared with the output voltage V3 of the differential amplifier 74 by means of the reference voltage V4 of the comparator 76. If it is under the threshold value dependent upon the reference value V4, the output voltage V5 is deemed to be on an H-level. In this case, the first fan control circuit 16 controls the rotation speed of the cooling fan 20 in response to the environmental temperature detected by the thermistor 26. When an increase in the output power capacity to the load from the switching regulator reduces the output voltage V5 of the comparator to an L-level, the base current $I_{b2}$ of the transistor 94 becomes maximum under the effect of cutoff of the transistor 92. The cooling fan 20 is thus driven with the maximum value of the collector current $I_{c2}$, and the speed is switched over to the maximum rotation speed.

Figure 6:
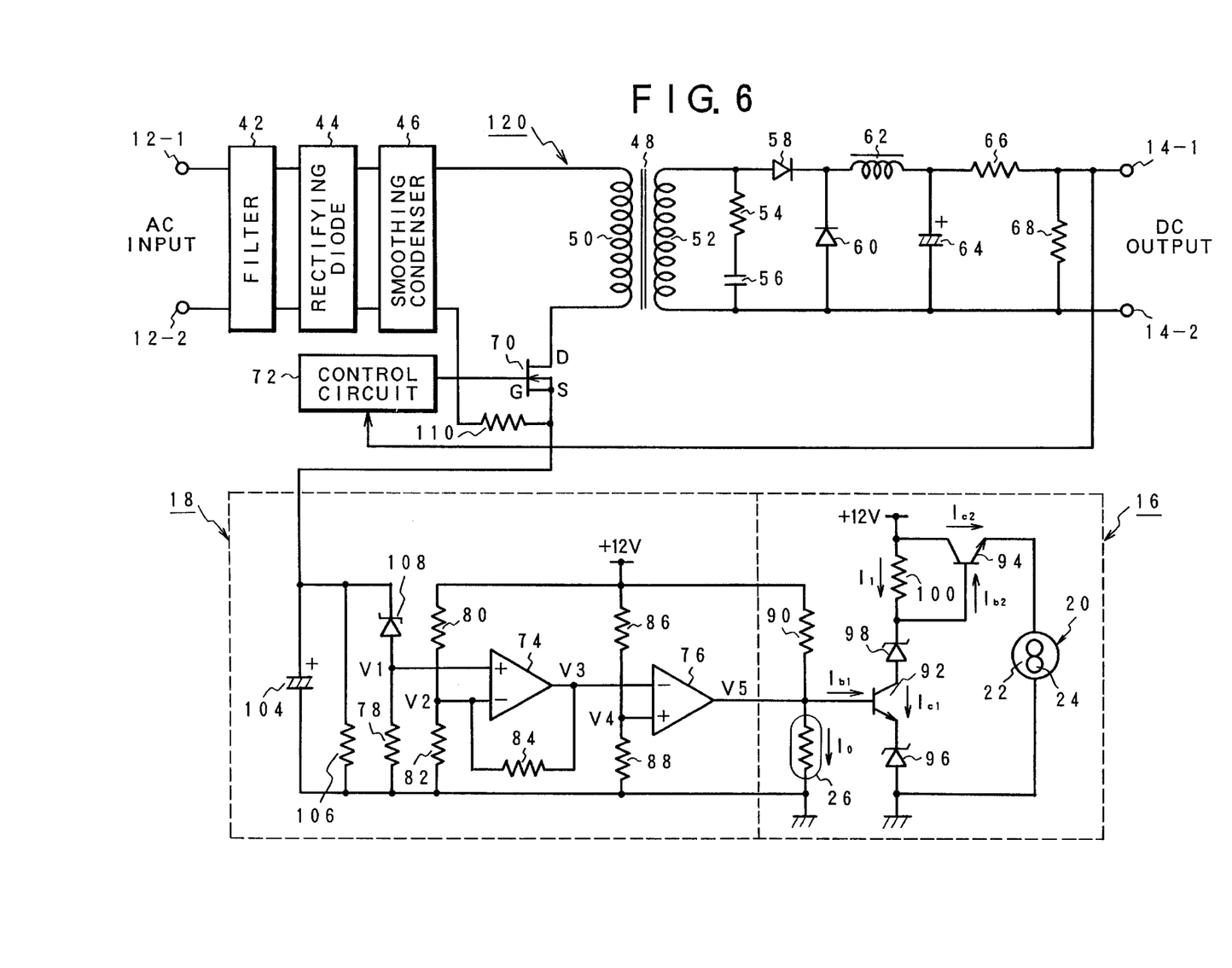
FIG. 6 is a circuit diagram of an embodiment of the invention, which detects an output power capacity from a source current of a primary-side FET of the switching regulator.

FIG. 6 is a circuit diagram of another embodiment of the invention using the switching regulator as a power supply circuit. In this embodiment, the output power capacity fed to the load is detected from the source current of a primary-side FET 70 of the switching regulator. The switching regulator 120, the first fan control circuit 16 and the second fan control circuit 18 are the same as in the embodiment shown in FIG. 5. In this embodiment, as the detection input to the second fan control circuit 18, a voltage produced at both ends of a current detection resistance 110 provided in series with a source S of the FET 70 provided on the primary side of the switching regulator 120 is entered into the second fan control circuit 18. A smoothing capacitor 104, a resistance 106 and a Zener diode 108 are provided in this input circuit. A voltage corresponding to one-direction current flowing under switching control of the FET 70 is smoothed by the capacitor 104 and produced at the both ends of the resistance 106, and the produced voltage is impressed onto a plus input terminal of the differential amplifier 74 as a detection voltage V1 via the Zener diode 108. In this embodiment, an increase in the output power capacity fed from the switching regulator 120 to the load results in an increase in the period of flow of source current in total through an increase in the ON-period of the switching control of the FET 70 resulting from a decrease in the output voltage caused by the control circuit 72. The relationship in this case is such that the detection voltage smoothed by the capacitor 104 along with this increases, and the detection voltage V1 of the differential amplifier 74 impressed via the Zener diode 10 increases. As a result, when the output power capacity to the load is under a threshold value, the output of the comparator 76 is on an H-level, and the cooling fan 20 is controlled for the rotation speed in response to the environmental temperature detected by the thermistor 26. When the output power capacity to the load is over the threshold value, in contrast, the output of the comparator becomes on-an L-level. The cooling fan 20 is controlled at the maximum rotation speed by cutting off the transistor 92 and feeding a collector current $I_{c2}$ giving the maximum current to the transistor 94.

Figure 7:
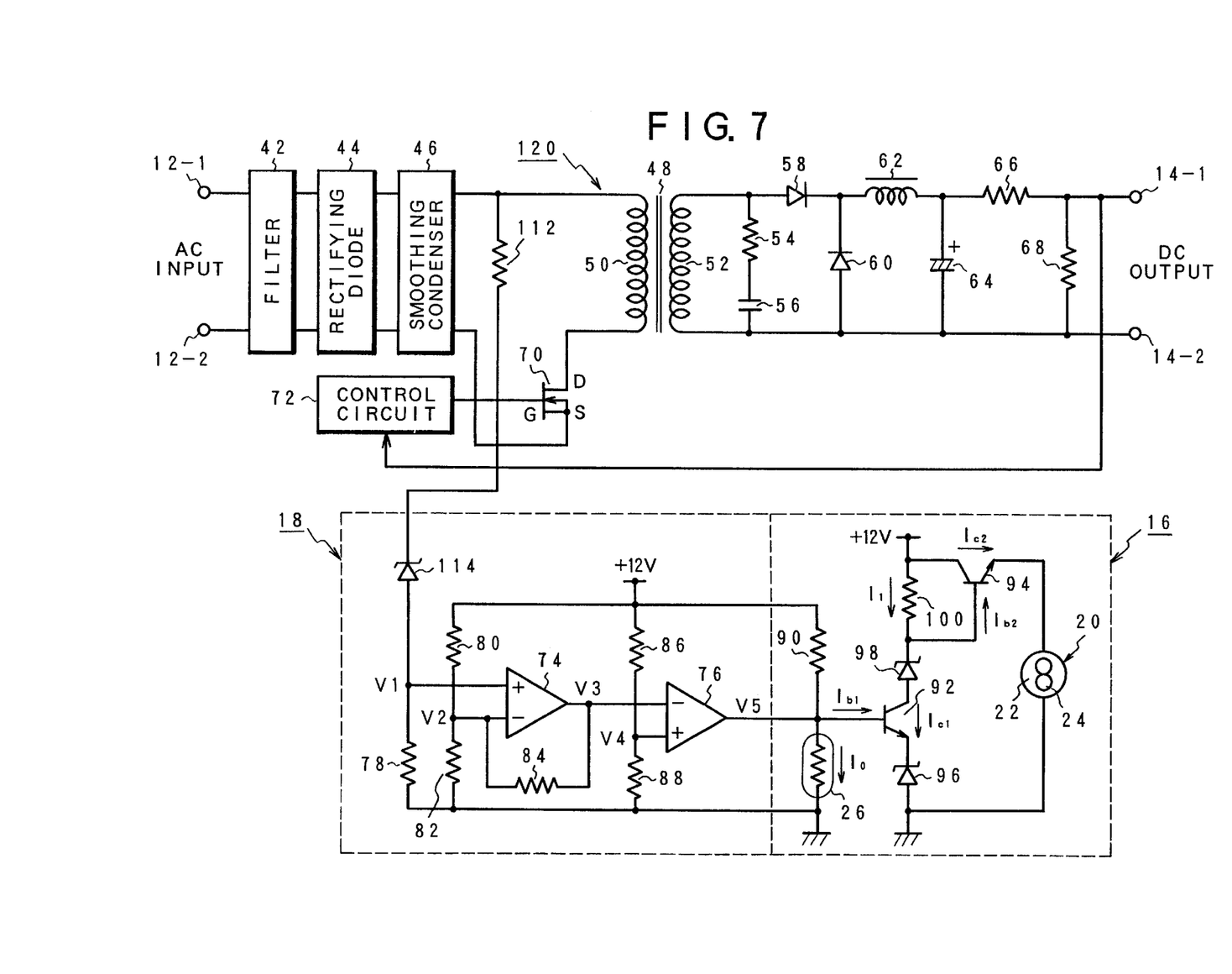
FIG. 7 is a circuit diagram of an embodiment of the invention, which detects an output power capacity from a primary-side input voltage of the switching regulator.

FIG. 7 is a circuit diagram of still another embodiment of the invention using the switching regulator 120 as the power supply circuit. This embodiment is characterized in that the output power capacity to the load is detected from the input DC voltage on the primary side of the switching regulator 120. The switching regulator 120, the first fan control circuit 16, and the second fan control circuit 18 are basically the same as in the embodiment shown in FIG. 4 except that plus and minus of input to the comparator 76 are just reverse. In the embodiment shown in FIG. 7, as a detection value of the output power capacity to the load for the second fan control circuit 18, the input DC voltage obtained from the smoothing capacitor 46 is produced at both ends of the resistance 78 via the resistance 112 and the Zener diode 114. The resultant voltage is impressed, as a detection voltage V1, onto the plus input terminal of the differential amplifier 47. An increase in the output power capacity fed from the switching regulator 120 results in an increase in energy converted from the primary side to the secondary side of the transformer 48 under switching control of the FET 70 by the control circuit 72. This leads to a decrease in the input DC voltage from the smoothing capacitor 46. The detection voltage V1 of the second fan control circuit 18 is in a relationship with the output power capacity such that it decreases along with the increase in the output power capacity. Unlike the comparators shown in FIGS. 4 to 7, therefore, the comparator 76 into which the output voltage V3 of the differential amplifier 74 has been entered is based on an inverted connection in that the output voltage V3 is connected to the plus input terminal, and the reference voltage V4 is connected to the minus input terminal. Along with the increase in the output power capacity fed to the load, the input DC voltage from the smoothing capacitor decreases, and the detection voltage V1 to the differential amplifier 74 is reduced as well. Since, with a smaller output power capacity, the output voltage V3 of the differential amplifier 74 is larger than the reference voltage V4, output of the comparator 76 is on an H-level, and the rotation speed of the cooling fan 20 is controlled in response to the environmental temperature detected by the thermistor 26. When an increase in the output power capacity to the load leads to a decrease in the output voltage V3 of the differential amplifier 74 to under the reference voltage V4, the output of the comparator 76 is reversed to an L-level. As a result, the transistor 92 is cut off, and the cooling fan 20 is controlled to the maximum rotation speed by feeding the maximum collector current $I_{c2}$ fed by the transistor 94.

According to the present invention, as described above, when the output power capacity from the power supply circuit to a load becomes larger, the rotation control of the cooling fan so far applied on the basis of the environmental temperature is disabled, irrespective of the extent of environmental temperature in the apparatus, and the cooling fan is controlled to the maximum rotation speed. As a result, cooling by forced circulation of sufficient air is started by controlling the cooling fan to the maximum rotation speed before an increase in the environmental temperature caused by heat generation of the load resulting from the increase in the output power capacity, thus ensuring prevention of a large increase in environmental temperature due to a delay in cooling. It is therefore possible to reduce the upper limit temperature of devices and parts used for the apparatus, hence to reduce the rating for the parts used, achieve a smaller heat sink for radiation from the present one, and thus reduce the cost of machines and units using the cooling fan controller of the invention.

In the embodiments described above, a change in the output power capacity fed from the switching regulator to the load is detected from the secondary-side output current, the secondary winding voltage, the source current of the primary-side FET, or the primary-side input DC voltage. The detection voltage may however be entered into the second fan control circuit 18 from an appropriate circuit portion other than the above which varies in response to a change in the output power capacity.

The switching regulator 120 shown in the aforementioned embodiments is only an example. Any of the presently available circuit type switching regulators may be applied with no modifications.

The present invention is not limited to the above embodiments, but includes any appropriate variant circuits so far as the objects and advantages of the invention are not impaired.

While the cooling fan is controlled by hardware circuits in the above embodiments, it is needless to mention that the control functions of the first fan control circuit 16 and the second fan control circuit 18 may be realized by a piece of software such as an MPU or a DSP.

What is claimed is:

1. A cooling fan controller controlling the rotation speed of a cooling fan, comprising:
    a first fan control circuit which controls the rotation speed of a cooling fan in response to the environmental temperature; and
    a second fan control circuit which detects the output power capacity of a power supplying section supplying power to a load, and which, when said output power capacity is under a prescribed threshold value, allows control of the cooling fan in response to the environmental temperature by said first fan control circuit, and when said output power capacity is at least the prescribed threshold value, disables cooling fan control in response to the environmental temperature by said first fan control circuit to control the same at a prescribed maximum rotation speed.

2. A controller according to claim 1, wherein:
    said first fan control circuit is a circuit which supplies a driving current substantially proportional to the environmental temperature detected with a temperature detecting element such as thermistor to a fan motor; and
    said second fan control circuit has a comparing circuit which causes supply of a current to said fan motor in response to the environmental temperature based on said first fan control circuit with an L-level output when the detected value of the output current capacity of the power supply circuit is under a prescribed threshold value, and disables control of the cooling fan in response to the environmental temperature of said first fan control circuit with an H-level output when said detected value is at least the prescribed threshold value, to cause supply of a prescribed maximum driving current to said fan motor.

3. A controller according to claim 1, wherein said second fan control circuit has a differential amplifying circuit which amplifies a detection signal of the output current capacity of the power supply circuit in the first half stage of said comparing circuit.

4. A controller according to claim 1, wherein:
    said first fan control circuit comprises a first transistor which feeds collector current substantially proportional to a change in the resistance value of thermistor inversely proportional to temperature, and second transistor which receives supply of base current obtained by subtracting the collector current of said first transistor from the prescribed bias current and supplies collector current to a fan motor; causes a change in collector current in response to the resistance value of said thermistor by biassing the base of said first transistor in the forward direction with an H-level output of said second fan control circuit; brings the collector current to zero by cutting off the base of said first transistor by reverse direction bias with an L-level output of said second fan control circuit; and fixes the collector current of said second transistor at a prescribed maximum current.

5. A controller according to claim 1, wherein said second control circuit detects current supplied from said power supply circuit to the load and compares the detected current with a prescribed threshold value.

6. A controller according to claim 1, wherein said power supply circuit is a switching regulator, and said second fan control circuit detects voltage of a secondary-side winding of a transformer provided in said switching regulator and compares the detected voltage with a prescribed threshold value.

7. A controller according to claim 1, wherein said power supply circuit is a switching regulator, and said second fan control circuit detects current fed by a switching element provided in said switching regulator to a primary-side winding of a transformer and compares the detected current with a prescribed threshold value.

8. A controller according to claim 1, wherein said power supply circuit is a switching regulator, and said second fan control circuit detects input voltage to a primary-side winding of a transformer provided in said switching regulator.

9. A controller comprising:
    an output detecting unit detecting the output capacity to a load;

a temperature detecting unit detecting environmental temperature; and a control unit which controls the rotation speed of a cooling fan on the basis of said output capacity and said environmental temperature, and when said output capacity is over a prescribed value, invalidates the control based on said environmental temperature.

10. A controller according to claim 9, wherein, when said output capacity is at least a prescribed value, said control unit invalidate the control based on said environmental temperature, and controls the cooling fan at a prescribed maximum rotation speed.

* * * * *